(12) United States Patent
Liu et al.

(10) Patent No.: US 8,567,484 B2
(45) Date of Patent: *Oct. 29, 2013

(54) HEAT DISSIPATION DEVICE WITH ROTATION-LOCKED HEAT SINK

(75) Inventors: Heng Liu, Shenzhen (CN); Jing Zhang, Shenzhen (CN)

(73) Assignees: Fu Zhun Precision Industry (Shen Zhen) Co., Ltd., Shenzhen (CN); Foxconn Technology Co., Ltd., New Taipei (TW)

( * ) Notice: Subject to any disclaimer, the term of this patent is extended or adjusted under 35 U.S.C. 154(b) by 820 days.

This patent is subject to a terminal disclaimer.

(21) Appl. No.: 12/773,001

(22) Filed: May 3, 2010

(65) Prior Publication Data

US 2011/0132573 A1 Jun. 9, 2011

(30) Foreign Application Priority Data

Dec. 9, 2009 (CN) .......................... 2009 1 0311119

(51) Int. Cl.
*H05K 7/20* (2006.01)

(52) U.S. Cl.
USPC ........... 165/80.3; 165/121; 361/697; 361/704

(58) Field of Classification Search
USPC .......................... 165/80.3, 121; 361/697, 704
See application file for complete search history.

(56) References Cited

U.S. PATENT DOCUMENTS

| | | | |
|---|---|---|---|
| 6,826,052 B2 * | 11/2004 | Ma .............................. | 165/80.3 |
| 7,123,483 B2 * | 10/2006 | Otsuki et al. .................. | 361/697 |
| 7,164,582 B2 * | 1/2007 | Hegde ............................ | 361/697 |
| 7,495,921 B2 * | 2/2009 | Chang et al. .................. | 165/80.3 |
| 7,532,472 B2 * | 5/2009 | Lin et al. ....................... | 361/697 |
| 7,583,503 B2 * | 9/2009 | Lin ................................ | 361/704 |
| 7,778,032 B2 * | 8/2010 | Yang et al. .................... | 361/697 |
| 8,210,241 B2 * | 7/2012 | Otsuki et al. ................. | 165/80.3 |
| 8,365,811 B2 * | 2/2013 | Yamashita et al. ........... | 165/80.3 |
| 8,430,152 B2 * | 4/2013 | Liu et al. ...................... | 165/80.3 |
| 2004/0136160 A1 * | 7/2004 | Lee et al. ...................... | 361/697 |

* cited by examiner

*Primary Examiner* — Leonard R Leo
(74) *Attorney, Agent, or Firm* — Altis & Wispro Law Group, Inc.

(57) ABSTRACT

An exemplary heat dissipation device includes a heat sink and a fixing frame. The heat sink defines receiving depressions at an outer peripheral surface thereof. The fixing frame includes a peripheral side plate encircling the heat sink, fixing legs extending downwards from the side plate, and an elastic member disposed on the side plate. Protruding members extend inwardly from the fixing legs. The heat sink is rotatably received in the fixing frame. When the heat sink is in an unlocked state, the protruding members align with the receiving depressions, respectively. When the heat sink is rotated to a locked state, the protruding members abut a bottom of the heat sink thereby limiting axial movement of the heat sink relative to the fixing frame and the elastic member is received in a corresponding receiving depression and limit rotation of the heat sink in both clockwise and counterclockwise directions.

18 Claims, 6 Drawing Sheets

HEAT DISSIPATION DEVICE WITH ROTATION-LOCKED HEAT SINK

CROSS-REFERENCES TO RELATED APPLICATION

This application is related to U.S. patent application Ser. No. 12/760,562 filed on Apr. 15, 2010 and entitled "HEAT DISSIPATION DEVICE." Such co-pending U.S. patent application is assigned to the same assignee as the instant application. The disclosure of the above-identified application is incorporated herein by reference.

BACKGROUND

1. Technical Field

The present disclosure relates to heat dissipation devices, and particularly to a heat dissipation device having a heat sink received in a fixing frame.

2. Description of Related Art

Heat dissipation devices are commonly used for cooling electronic components such as central processing units (CPUs).

Generally, a heat dissipation device includes a heat sink and a fastener for mounting the heat sink to an electronic component seated on a print circuit board (PCB). The fastener comprises a pin and a spring disposed around the pin. The pin has a head at an end thereof and a clamping portion at an opposite end thereof. The clamping portion has an anchor-shaped cross-section, and comprises a pair of hooks extending upwardly and outwardly from a bottom thereof towards two opposite sides thereof. A tab extends upwardly from an inner side of each hook. The pin of the fastener passes through the heat sink and the PCB. The spring is compressed between the head of the pin and the heat sink to provide a spring force impelling the hooks of the clamping portion to clamp a bottom face of the PCB, thereby attaching the heat sink to the electronic component.

Before the fastener is applied to the heat sink, the spring and the pin are separated from each other. The spring must be manually coiled around the pin of the fastener before the fastener is applied to the heat sink. This is a time-consuming and inconvenient operation.

It is thus desirable to provide a heat dissipation device which can overcome the above-described limitations.

DETAILED DESCRIPTION

Reference will now be made to the drawing figures to describe various embodiments of the present heat dissipation device in detail.

Figure 1:
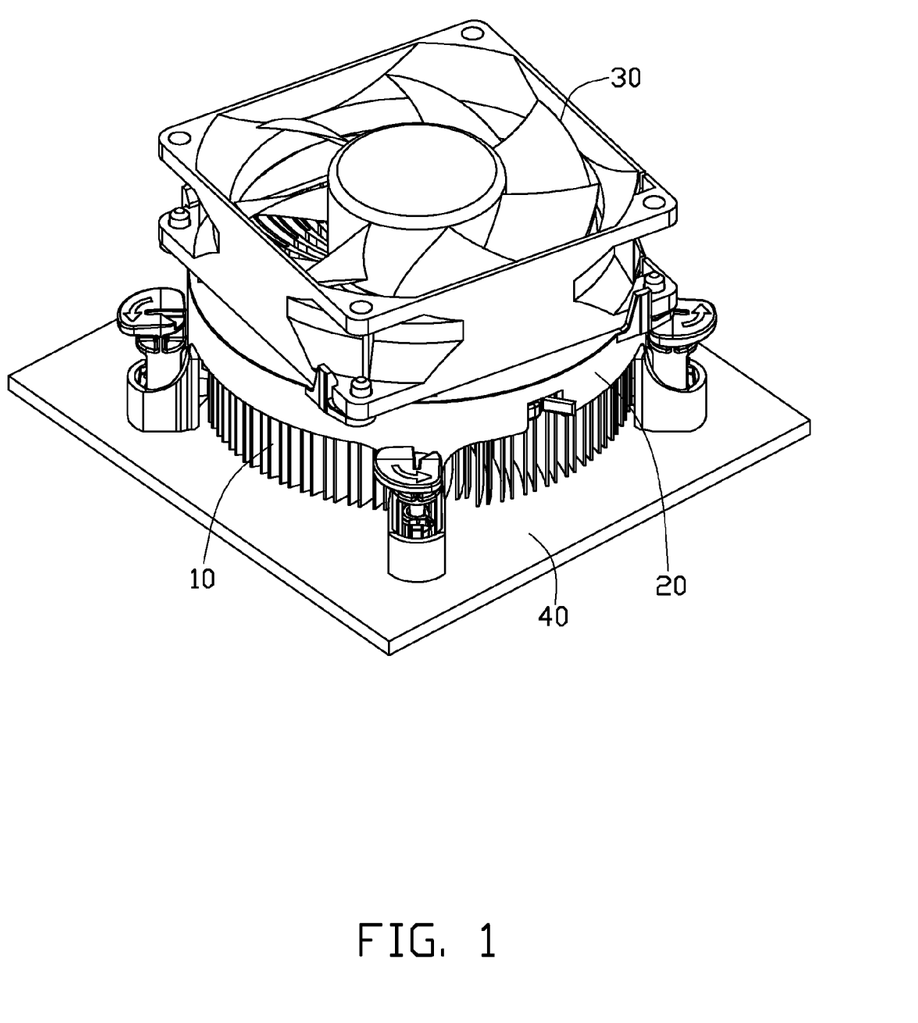
FIG. 1 is an isometric, assembled view of a heat dissipation device in accordance with an embodiment of the disclosure, wherein the heat dissipation device is mounted on a printed circuit board (PCB).
Figure 2:
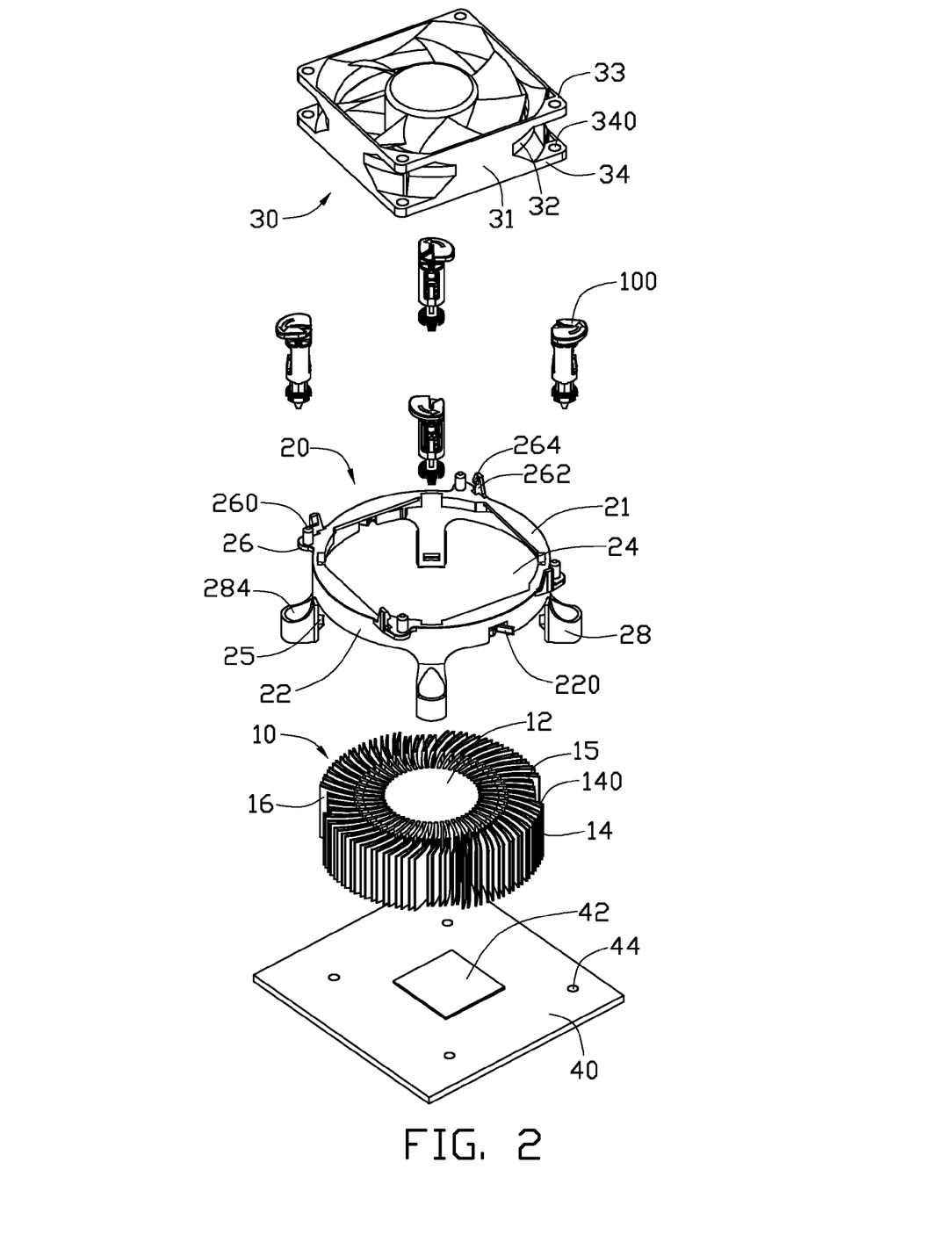
FIG. 2 is an isometric, exploded view of the heat dissipation device and the PCB of FIG. 1.
Figure 3:
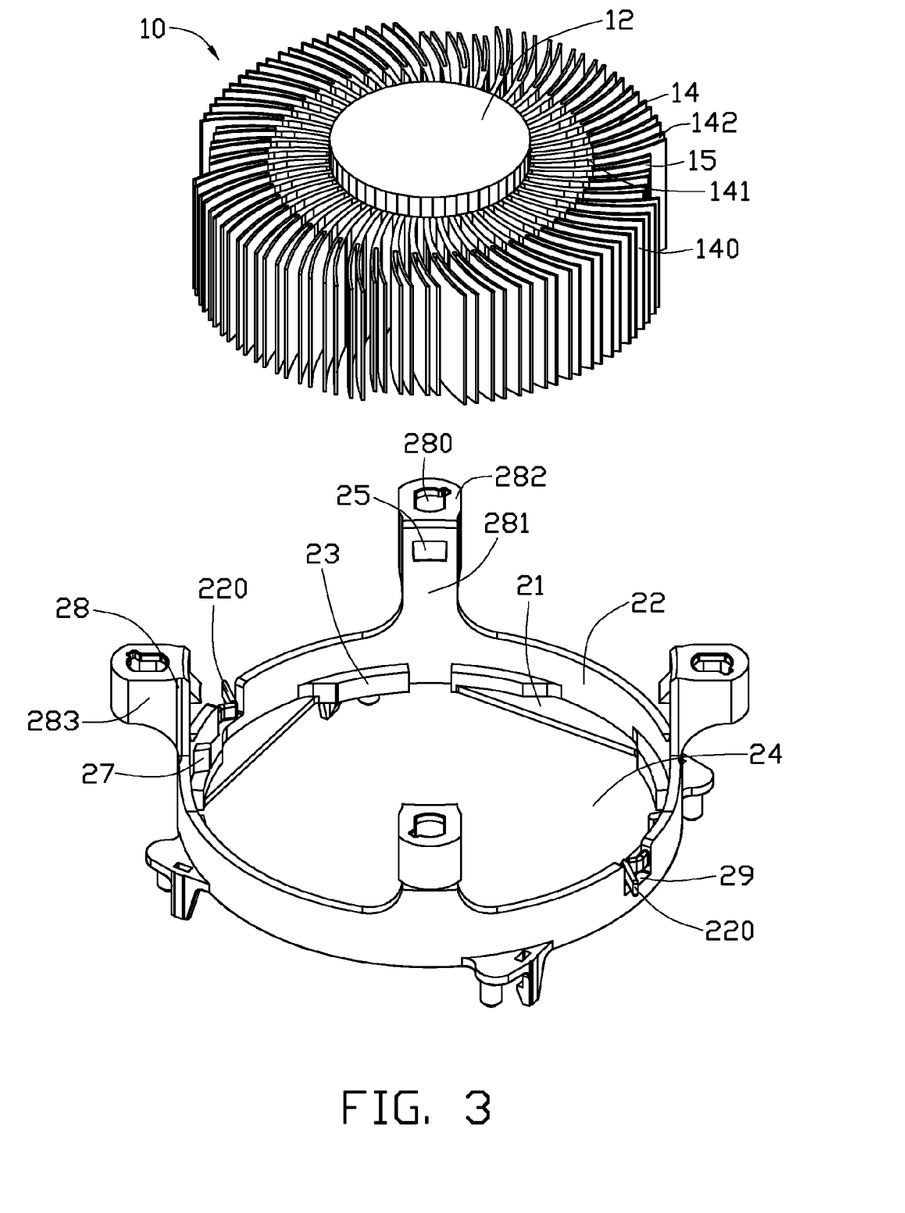
FIG. 3 is an isometric, exploded view of a heat sink and a fixing frame of the heat dissipation device of FIG. 2, showing the heat sink and the fixing frame inverted.

Referring to FIGS. 1-3, a heat dissipation device according to an embodiment is disclosed. In the present embodiment, the heat dissipation device is applied for dissipating heat generated by an electronic component 42 mounted on a printed circuit board (PCB) 40. The heat dissipation device comprises a heat sink 10 attached to the electronic component 42, a fan 30, and a fixing frame 20. The fan 30 is mounted to the heat sink 10 via the fixing frame 20.

The heat sink 10 is substantially cylindrical. The heat sink 10 can be made of a metallic material having some resiliency and good heat conductivity, such as aluminum, copper, etc. The heat sink 10 comprises a cylindrical core 12, and four sets of first fins 14 and four sets of second fins 15 extending outwardly and generally radially from an outer surface of the cylindrical core 12. The sets of first fins 14 and the sets of second fins 15 are alternately arranged along a circumferential direction of the cylindrical core 12. Each set of first fins 14 is wider than each set of second fins 15, as measured along the circumferential direction of the heat sink 10. Each of the first and second fins 14, 15 comprises an inner portion 141 connected to the outer surface of the cylindrical core 12, and two branches 142 extending outwards from the inner portion 141. A slit 140 is defined between the two branches 142. In the present embodiment, the first and second fins 14, 15 are fabricated by extrusion.

The first and second fins 14, 15 are all curved, and are all oriented along substantially the same direction relative to radial directions of the heat sink 10. With this configuration, a surface area of the heat sink 10 is increased. In the present embodiment, the first and second fins 14, 15 are curved outwards in a generally clockwise direction as viewed from a top of the heat sink 10 in FIG. 2. The first fins 14 are longer than the second fins 15, as measured along the radial directions of the heat sink 10. Thus, a receiving depression 16 is defined at outer ends of each set of second fins 15. That is, each receiving depression 16 is located between two neighboring sets of first fins 14. Accordingly, four receiving depressions 16 corresponding to the four sets of second fins 15 are defined between the sets of first fins 14. The receiving depressions 16 are equally spaced from each other.

The fan 30 comprises a housing 31. The housing 31 comprises an annular sidewall 32, and a top wall 33 and a bottom wall 34 extending outwardly from top and bottom ends of the sidewall 32, respectively. Each of the top and bottom walls 33, 34 has a rectangular outline. Four through holes 340 are defined in four corners of the bottom wall 34, respectively.

The fixing frame 20 is typically made of plastic material, and formed by an integral molding method. Alternatively, the fixing frame 20 can be made of metallic material having high rigidity. The fixing frame 20 comprises a circular top plate 21 defining a square hole 24 at the center thereof, an annular side plate 22 extending downwardly and perpendicularly from an outer periphery of the top plate 21, and four fixing legs 28 extending downwardly from a bottom of the side plate 22. Four ears 26 equally spaced from each other extend outwardly from the outer periphery of the top plate 21. Each ear 26 is substantially triangular. A mounting post 260 and a fastening arm 262 extend upwardly and perpendicularly from a top surface of each of the ears 26, respectively. The mounting posts 260 correspond to the through holes 340 of the bottom wall 34 of the fan 30, respectively. Each of the fastening arms 262 includes a hook 264 extending inwardly from a top end thereof.

The number of fixing legs 28 is equal to the number of receiving depressions 16 of the heat sink 10. Each of the fixing legs 28 comprises a vertical wall 281 extending downwardly from the bottom of the side plate 22, and a horizontal wall 282 extending outwardly and perpendicularly from a bottom end of the vertical wall 281. The vertical wall 281 comprises an inner surface and an outer surface. The inner surfaces of the vertical walls 281 and an inner surface of the side plate 22 are arranged along the same imaginary cylindrical surface. A protruding member 25 extends inwardly from the inner surface of the vertical wall 281 towards a center of the side plate 22. Each horizontal wall 282 defines a hole 280 therein. A circumferential wall 283 extends upwardly from a circumferential edge of the horizontal wall 282, with a side thereof extending to the outer surface of the vertical wall 281. The circumferential wall 283, the horizontal wall 282 and the vertical wall 281 cooperatively define a receiving space 284 (see FIG. 2). The receiving spaces 284 communicate with corresponding holes 280 of the horizontal walls 282.

In the present embodiment, a plurality of blocks 23 protrude inwardly from a top portion of the inner surface of the side plate 22. Each block 23 is located adjacent to the top plate 21, and is taller (or thicker) than the top plate 21 as measured parallel to a central axis of the side plate 22. A vertical distance between the protruding members 25 and the blocks 23 is substantially equal to the height of the heat sink 10 so that the heat sink 10 is sandwiched between the protruding members 15 and the blocks 23. In other embodiments, there are no blocks 23 disposed in the fixing frame 20, and the heat sink 10 is directly sandwiched between the protruding members 15 and the top plate 21.

Figure 4:
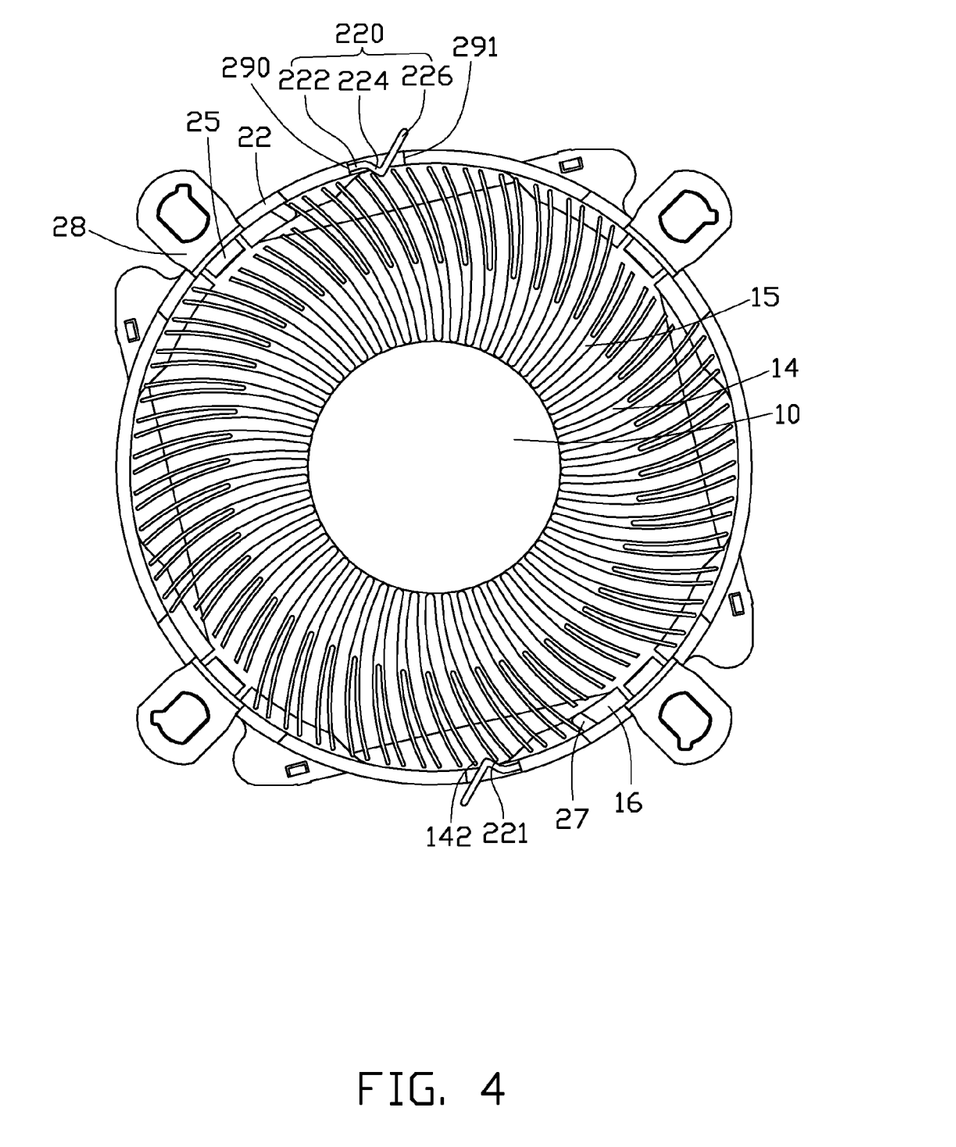
FIG. 4 is a bottom plan view of an assembly of the heat sink and the fixing frame in the unlocked position.

Referring also to FIG. 4, the side plate 22 has at least one elastic latching assembly provided thereon. The at least one elastic latching assembly is located between two neighboring fixing legs 28, and is adjacent to one of the two neighboring fixing legs 28. The at least one elastic latching assembly comprises a rib 27 protruding inwardly from the inner surface of the side plate 22, and an elastic member 220 cooperating with the rib 27. The elastic member 220 is spaced from the rib 27. The elastic member 220 is farther away from the one of the two neighboring fixing legs 28 than the rib 27. Each of the ribs 27 extends parallel to the axis of the side plate 22, and is perpendicular to the top plate 21. Each rib 27 inclines towards a corresponding branch 142 of the heat sink 10 so that a side surface (not labeled) of the rib 27 can abut a side surface of the corresponding branch 142.

The side plate 22 defines a plurality of cutouts 29 therein. Each of the cutouts 29 extends laterally through the side plate 22. Each of the cutouts 29 has a first vertical side surface 290 close to the one of the two neighboring fixing legs 28, and a second vertical side surface 291 farther away from the one of the two neighboring fixing legs 28. The number of cutouts 29 is equal to the number of elastic members 220. That is, the cutouts 29 correspond to the elastic members 220. Each elastic member 220 bends from the corresponding first vertical side surface 290 towards the corresponding second vertical side surface 291. The elastic member 220 has a V-shaped cross section. The elastic member 220 comprises a retaining sheet 222 extending substantially coplanarly from the first vertical side surface 290, a connecting sheet 224 extending obliquely inwards from an end of the retaining sheet 222, and a free sheet 226 extending outwards from an end of the connecting sheet 224. The free sheet 226 has a free end protruding outside of the side plate 22. An elbow where the connecting sheet 224 and the free sheet 226 adjoin each other is located at an inside of the side plate 22. In other embodiments, the connecting sheet 224 bends directly from the first vertical side surface 290 towards the inside of the side plate 22. That is, there is no need to dispose the retaining sheet 222 extending from the first vertical side surface 290. In the present embodiment, the connecting sheet 224 has an oblique guiding face 221 facing the inside of the side plate 22.

In the present embodiment, the side plate 22 has two elastic latching assemblies, wherein two ribs 27 are symmetrical relative to the axis of the side plate 22, and two elastic members 220 are symmetrical relative to the axis of the side plate 22. Alternatively, the side plate 22 can have multiple elastic latching assemblies, for example, four elastic latching assemblies. In such case, the four elastic latching assemblies correspond to the receiving depressions 16 of the heat sink 10.

When the heat sink 10 and the fixing frame 20 are assembled, both the heat sink 10 and the fixing frame 20 are firstly placed upside-down, with the fins 14, 15 curved generally counterclockwise as viewed in FIG. 4. The heat sink 10 is put into the side plate 22, with a top of the heat sink 10 abutting the blocks 23, and the receiving depressions 16 of the heat sink 10 in alignment with the fixing legs 28, respectively. The protruding members 25 are located immediately above the receiving depressions 16, respectively, as viewed in FIG. 4. Each of the ribs 27 is received in a corresponding one of the receiving depressions 16. In the present embodiment, each of the ribs 27 abuts an outermost first fin 14 of a corresponding set of first fins 14, as seen in FIG. 4. In other embodiments, each of the ribs 27 is spaced a distance from the outermost first fin 14 of the corresponding set of first fins 14. In the present embodiment, the elbow of each of the elastic members 220 is located between two neighboring branches 142 of the corresponding set of first fins 14. In this state, the heat sink 10 is rotatable with respect to the fixing frame 20, with the heat sink 10 and the fixing frame 20 being in an unlocked state.

Figure 5:
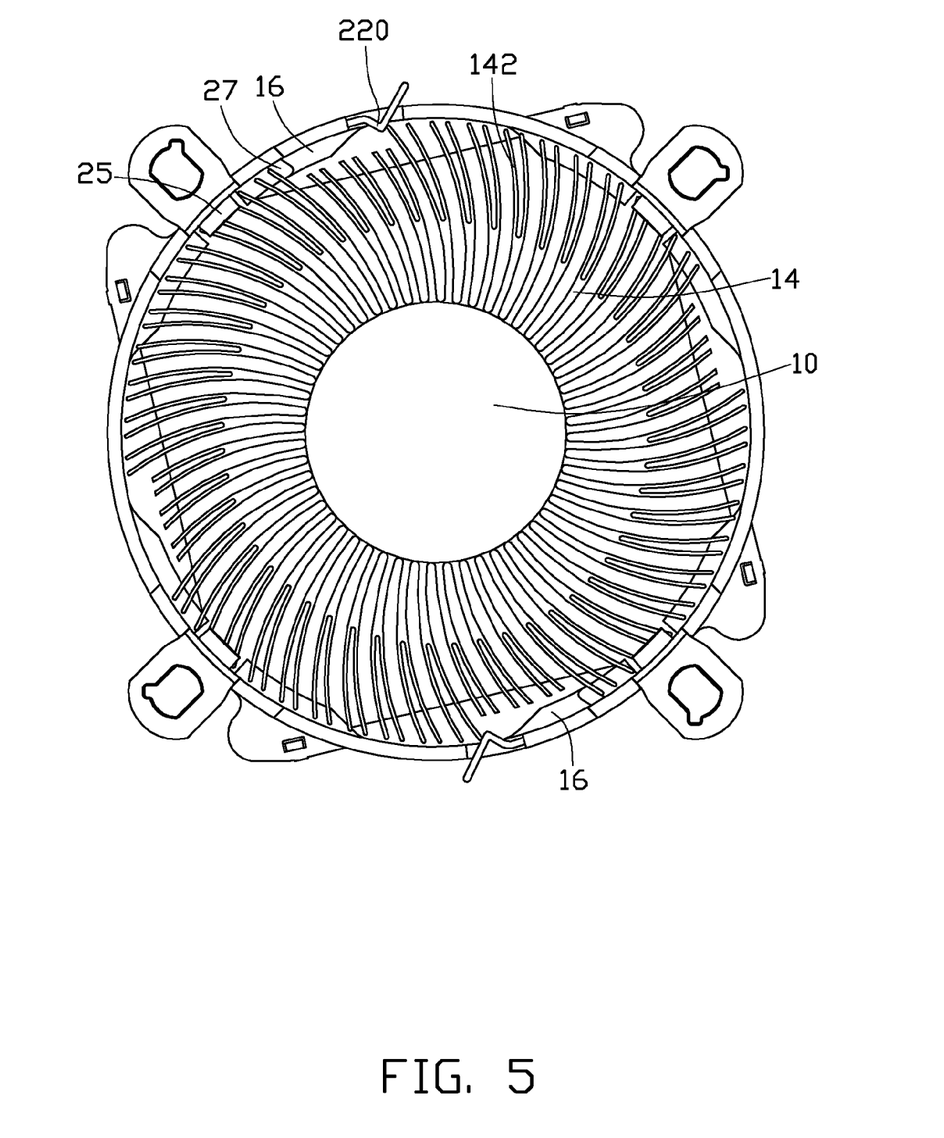
FIG. 5 is similar to FIG. 4, but shows the assembly of the heat sink and the fixing frame in a locked position.

Referring also to FIG. 5, the heat sink 10 is then rotated clockwise as viewed in FIGS. 4-5. During such rotation, outer ends of the branches 142 of certain first fins 14 of the corresponding set of first fins 14 ride over the elbow of each elastic member 220. By provision of the oblique guiding faces 221 of the connecting sheets 224, only a small force is needed for the outer ends of the branches 142 of the first fins 14 to ride over the elbows of the elastic members 220. Therefore, the heat sink 10 can be easily rotated in the fixing frame 20. The rotation is continued until each of the ribs 27 abuts a side surface of an outermost first fin 14 of an adjacent set of first fins 14 which is adjacent to the corresponding set of first fins 14. At the same time, the free sheet 226 of each elastic member 220 abuts the outermost first fin 14 of the corresponding set of first fins 14. That is, the rib 27 and the free sheet 226 of each elastic latching assembly respectively abut two first fins 14 located at two opposite sides of the corresponding receiving depression 16 of the heat sink 10, to prevent further clockwise rotation or counterclockwise rotation of the heat sink 10 relative to the fixing frame 20. In this position, the protruding members 25 of the fixing legs 28 abut bottoms of the branches 142 of certain first fins 14 of the adjacent set of first fins 14. The protruding members 25 and the blocks 23 cooperatively limit axial movement of the heat sink 10 relative to the fixing frame 20. Thus, the heat sink 10 and the fixing frame 20 are in a locked state.

Figure 6:
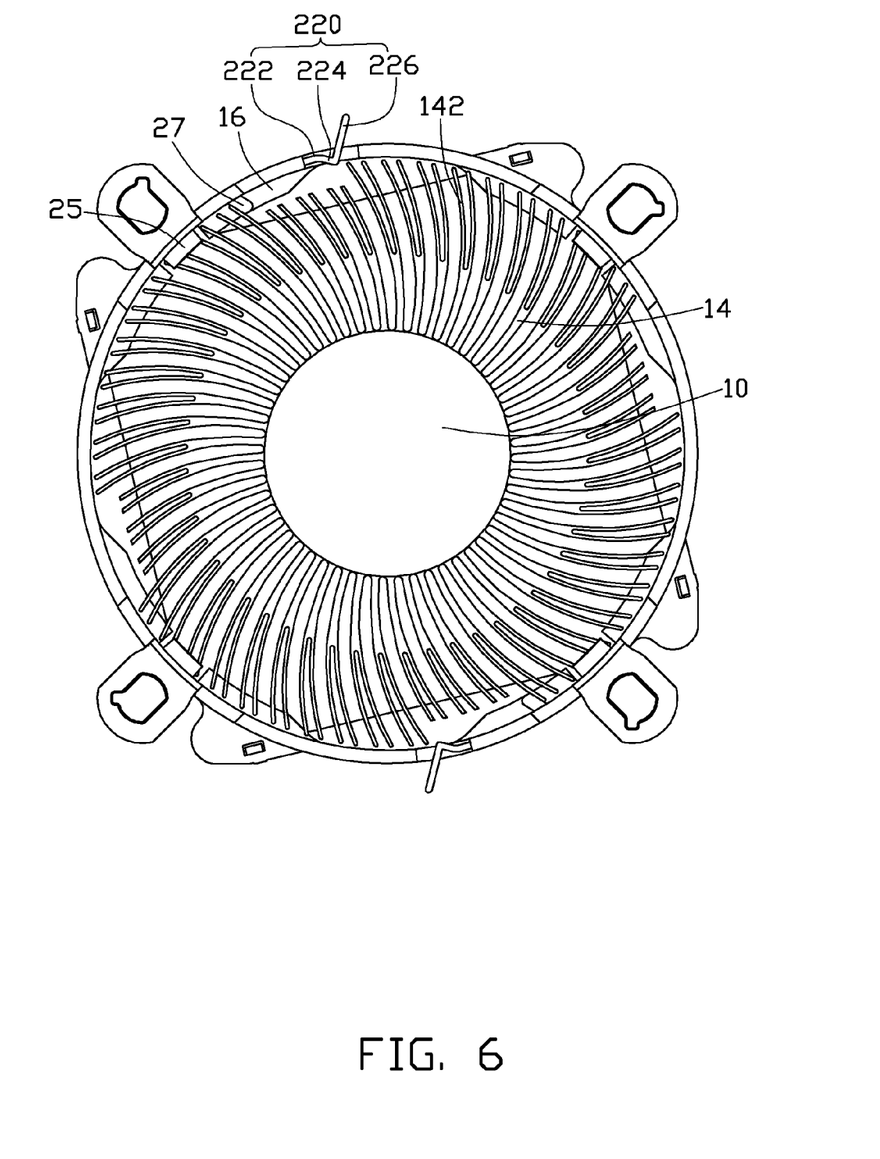
FIG. 6 is similar to FIG. 5, but shows the assembly of the heat sink and the fixing frame in an unfastened position.

Referring also to FIG. 6, when the heat sink 10 and the fixing frame 20 are disassembled, a generally outward force is exerted on the free end of the free sheet 226 of each elastic member 220 so that the free sheet 226 is bent outwardly and in a generally counterclockwise direction (as viewed in FIG. 6) to such an extent that the elbow moves outwardly beyond the outer ends of the branches 142 of the first fins 14. The heat sink 10 is then rotated counterclockwise (as viewed in FIG. 6) until the protruding members 25 of the fixing frame 20 correspond to the receiving depressions 16 of the heat sink 10. Thus, the heat sink 10 is disassembled from the fixing frame 20.

As detailed above, when the heat sink 10 is rotated in the fixing frame 20 from the unlocked state to the locked state, only a small force is needed to rotate the heat sink 10. Thus, the heat sink 10 can be easily attached and locked to the fixing frame 20. In addition, by exerting the generally outward forces on the free ends of the free sheets 226 and then rotating the heat sink 10, the heat sink 10 can be easily disassembled from the fixing frame 20.

Referring back to FIG. 1, the fan 30 is then mounted onto the heat sink 10, with a bottom surface of the bottom wall 34 contacting a top surface of the top plate 21. The mounting posts 260 of the fixing frame 20 are received in the through holes 340 of the bottom wall 34, respectively. The hooks 264 of the fastening arms 262 grasp a periphery of the bottom wall 34 and abut a top surface of the bottom wall 34. Thus, the fan 30 is firmly secured to the combined heat sink 10 and fixing frame 20. Finally, a plurality of fasteners 100, such as bolts, are extended through the holes 280 of the fixing legs 28 of the fixing frame 20, to respectively engage the print circuit board 40. Thereby, the heat dissipation device makes good contact with the electronic component 42.

It is to be understood, however, that even though numerous characteristics and advantages of various embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation device, comprising:
a round heat sink defining a plurality of receiving depressions at a peripheral surface thereof; and
a fixing frame comprising a top plate, a peripheral side plate extending downwards from a periphery of the top plate, a plurality of fixing legs extending downwards from the peripheral side plate, and an elastic member disposed on the peripheral side plate, the peripheral side plate encircling the heat sink, and a plurality of protruding members extending inwardly from the fixing legs;
wherein the heat sink is received in the fixing frame;
when the heat sink is in an unlocked state, the protruding members of the fixing frame align with corresponding receiving depressions of the heat sink; and
when the heat sink is rotated in a first direction relative to the fixing frame to a locked state, the protruding members abut a bottom of the heat sink thereby limiting axial movement of the heat sink relative to the fixing frame and the elastic member is received in a corresponding receiving depression and limits rotation of the heat sink relative to the fixing frame in a second direction that is opposite to the first direction.

2. The heat dissipation device of claim 1, further comprising a rib protruding inwardly from the peripheral side plate of the fixing frame, wherein the rib is spaced a distance from the elastic member along a circumferential direction of the heat sink.

3. The heat dissipation device of claim 2, wherein when the heat sink is in the locked state, the rib is received in the corresponding receiving depression and limits further rotation of the heat sink in the first direction.

4. The heat dissipation device of claim 3, wherein the elastic member comprises a connecting sheet extending from the peripheral side plate of the fixing frame generally towards an inside of the fixing frame, and a free sheet bending from an end of the connecting sheet generally towards an outside of the fixing frame.

5. The heat dissipation device of claim 4, wherein the free sheet has a free end protruding beyond the peripheral side plate outside of the fixing frame.

6. The heat dissipation device of claim 4, wherein the free sheet of the elastic member is farther away from the rib than the connecting sheet.

7. The heat dissipation device of claim 4, wherein the heat sink comprises a cylindrical core, and a plurality of sets of first fins and a plurality of sets of second fins extending outwardly from an outer surface of the cylindrical core, the plurality of sets of first fins and the plurality of sets of second fins being alternately arranged along the circumferential direction of the heat sink, each set of first fins being wider than each set of second fins as measured along the circumferential direction of the heat sink, and each of the receiving depressions thereby being provided between two corresponding neighboring sets of first fins.

8. The heat dissipation device of claim 7, wherein the first and second fins are all curved, and are all oriented along substantially a same direction relative to radial directions of the heat sink, said same direction corresponding to the second direction.

9. The heat dissipation device of claim 7, wherein when the heat sink is in the unlocked state, the rib is received in the corresponding receiving depression of the heat sink, and an elbow where the connecting sheet and the free sheet adjoin each other is located between two adjacent first fins; and when the heat sink is rotated to the locked state, an outer end of at least one of the first fins rides over the elbow, and the outer end of a last one of the at least one of the first fins to ride over the elbow abuts the free sheet.

10. The heat dissipation device of claim 9, wherein when the heat sink is in the locked state, the rib and the free sheet of the elastic member abut two first fins located at two opposite sides of the corresponding receiving depression of the heat sink, respectively, thereby limiting rotational movement of the heat sink in both the first and second directions.

11. The heat dissipation device of claim 1, wherein a plurality of blocks extend inwardly from an inner surface of the peripheral side plate of the fixing frame, and a top of the heat sink abuts the blocks.

12. The heat dissipation device of claim 11, wherein when the heat sink is in the locked state, the blocks and the protruding members abut the top and bottom of the heat sink, respectively, to cooperatively limit axial movement of the heat sink relative to the fixing frame in both of opposite directions of an axis of the fixing frame.

13. The heat dissipation device of claim 1, wherein the heat sink is substantially cylindrical in configuration.

14. The heat dissipation device of claim 1, further comprising a fan mounted on the fixing frame, the fan defining a plurality of through holes at corners thereof, a plurality of ears corresponding to the corners of the fan extending outwardly from the peripheral side plate, and a plurality of mounting posts extending upwardly from the ears into the through holes of the fan, respectively.

15. The heat dissipation device of claim 14, wherein a plurality of fastening arms extends upwardly from the ears, each fastening arm comprising a hook at a top end thereof, the hook grasping a periphery of the fan.

16. A heat dissipation device, comprising:
a round heat sink defining a plurality of receiving depressions at a peripheral surface thereof; and a fixing frame comprising a top plate, a peripheral side plate extending downwards from a periphery of the top plate, a plurality of fixing legs extending downwards from the peripheral side plate, an elastic member disposed on the peripheral side plate, and a rib protruding inwardly from the peripheral side plate, the peripheral side plate encircling the heat sink, and a plurality of protruding members extending inwardly from the fixing legs;

wherein the heat sink is rotatably received in the fixing frame;

when the heat sink is in an unlocked state, the protruding members align with the receiving depressions, respectively, and the rib aligns with one corresponding receiving depression; and when the heat sink is rotated to a locked state, the protruding members abut a bottom of the heat sink thereby limiting axial movement of the heat sink relative to the fixing frame, and the elastic member and the rib are received in the corresponding receiving depression and limit rotation of the heat sink in both clockwise and counterclockwise directions.

17. The heat dissipation device of claim 16, wherein the rib is located between the elastic member and an adjacent protruding member along a circumferential direction of the heat sink.

18. The heat dissipation device of claim 16, wherein the elastic member comprises a connecting sheet extending from the peripheral side plate of the fixing frame generally towards an inside of the fixing frame, and a free sheet bending from an end of the connecting sheet generally towards an outside of the fixing frame.

\* \* \* \* \*